United States Patent
Hsu

(10) Patent No.: US 10,432,176 B2
(45) Date of Patent: Oct. 1, 2019

(54) RELAXATION OSCILLATORS WITH REDUCED ERRORS OR NO ERRORS IN OUTPUT FREQUENCIES CAUSED BY CHANGES IN TEMPERATURES AND/OR FABRICATION PROCESSES

(71) Applicant: SyncMOS Technologies International, Inc., Hsinchu (TW)

(72) Inventor: Jhih Yuan Hsu, Hsinchu (TW)

(73) Assignee: SYNCMOS TECHNOLOGIES INTERNATIONAL, INC., Hsinchu (TW)

( * ) Notice: Subject to any disclaimer, the term of this patent is extended or adjusted under 35 U.S.C. 154(b) by 109 days.

(21) Appl. No.: 15/492,946

(22) Filed: Apr. 20, 2017

(65) Prior Publication Data

US 2017/0353158 A1    Dec. 7, 2017

(30) Foreign Application Priority Data

Apr. 21, 2016 (CN) .......................... 2016 1 0251658

(51) Int. Cl.
*H03K 3/0231* (2006.01)
*H03K 4/501* (2006.01)
*H03K 3/011* (2006.01)

(52) U.S. Cl.
CPC ........... *H03K 3/0231* (2013.01); *H03K 3/011* (2013.01); *H03K 4/501* (2013.01)

(58) Field of Classification Search
CPC ......... H03K 3/011; H03K 4/501; H03K 4/502
See application file for complete search history.

(56) References Cited

U.S. PATENT DOCUMENTS 6,020,792 A    2/2000 Nolan et al.
6,930,520 B2   8/2005 Solie
(Continued)

FOREIGN PATENT DOCUMENTS

CN    1330090 C      8/2007
CN    101592528 A   12/2009
(Continued)

OTHER PUBLICATIONS

Taiwan Intellectual Property Office, Office Action dated Jan. 24, 2017, in Taiwan Patent Application No. 105117068.
(Continued)

*Primary Examiner* — Ryan Johnson
(74) *Attorney, Agent, or Firm* — Faegre Baker Daniels LLP

(57) ABSTRACT

Relaxation oscillator and method for providing an output frequency. For example, the relaxation oscillator includes a reference generator, a capacitor, a first comparator, a second comparator, a latch, and a temperature compensation circuit. The reference generator is configured to generate a first bias current, a first bias voltage and a second bias voltage. The capacitor is configured to be charged by a charging current to generate a charged voltage, and the charging current is generated based on at least the first bias current. The first comparator is configured to compare the charged voltage and the first bias voltage to generate a first comparison result, and the second comparator is configured to compare the charged voltage and the second bias voltage to generate a second comparison result. The latch is configured to generate a clock signal based on at least the first comparison result and the second comparison result.

26 Claims, 7 Drawing Sheets

(56) References Cited

U.S. PATENT DOCUMENTS

| | | | |
|---|---|---|---|
| 7,439,818 B2 | 10/2008 | Bakker | |
| 8,963,589 B1 * | 2/2015 | Ferrario | ............... H03K 4/50 327/131 |
| 9,287,823 B1 * | 3/2016 | Holzmann | ............ H01L 29/772 |

FOREIGN PATENT DOCUMENTS

| | | |
|---|---|---|
| CN | 102356549 A | 2/2012 |
| CN | 103645218 A | 3/2014 |
| CN | 103973226 A | 8/2014 |
| CN | 104836577 A | 8/2015 |
| TW | I-409610 B1 | 9/2013 |
| TW | 201611511 A | 3/2016 |

OTHER PUBLICATIONS

China Patent Office, Office Action dated Mar. 22, 2018, in Chinese Patent Application No. 201610251658.9.
China Patent Office, Office Action dated Aug. 27, 2018, in Chinese Patent Application No. 201610251658.9.

* cited by examiner

RELAXATION OSCILLATORS WITH REDUCED ERRORS OR NO ERRORS IN OUTPUT FREQUENCIES CAUSED BY CHANGES IN TEMPERATURES AND/OR FABRICATION PROCESSES

1. CROSS-REFERENCES TO RELATED APPLICATIONS

This application claims priority to Chinese Patent Application No. 201610251658.9, filed Apr. 21, 2016, incorporated by reference herein for all purposes.

2. BACKGROUND OF THE INVENTION

Certain embodiments of the present invention are directed to integrated circuits. More particularly, some embodiments of the invention provide a relaxation oscillator with reduced error or no error in output frequency caused by change in temperature and/or fabrication process. Merely by way of example, some embodiments of the invention have been applied to microcontrollers. But it would be recognized that the invention has a much broader range of applicability.

There are various types of conventional oscillators. For example, a conventional RC oscillator includes an odd number of stages of amplifiers. Usually the traditional RC oscillator generates a periodical clock signal by charging or discharging a capacitor, and the output frequency of the traditional RC oscillator depends on a RC time constant. Often the output frequency of the traditional RC oscillator is affected by changes in fabrication process (e.g., semiconductor process) and external temperature, and may contain a large error.

Hence it is highly desirable to improve the techniques of oscillators in order to improve precision of output frequency.

3. BRIEF SUMMARY OF THE INVENTION

Certain embodiments of the present invention are directed to integrated circuits. More particularly, some embodiments of the invention provide a relaxation oscillator with reduced error or no error in output frequency caused by change in temperature and/or fabrication process. Merely by way of example, some embodiments of the invention have been applied to microcontrollers. But it would be recognized that the invention has a much broader range of applicability.

In one embodiment, a relaxation oscillator includes a reference generator, a capacitor, a first comparator, a second comparator, a latch, and a temperature compensation circuit. The reference generator is configured to generate a first bias current, a first bias voltage and a second bias voltage. The capacitor is configured to be charged by a charging current to generate a charged voltage, and the charging current is generated based on at least the first bias current. The first comparator is configured to compare the charged voltage and the first bias voltage to generate a first comparison result, and the second comparator is configured to compare the charged voltage and the second bias voltage to generate a second comparison result. The latch is configured to generate a clock signal based on at least the first comparison result and the second comparison result. The clock signal is configured to be used to control charging and discharging of the capacitor, and a frequency of the clock signal is an output frequency of the relaxation oscillator. The temperature compensation circuit is configured to detect a change in temperature and adjusts bias currents of the first comparator and the second comparator based on at least the detected change in temperature, so that propagation delays of the first comparator and the second comparator remain stable and independent of the change in temperature.

In another embodiment, an oscillator for providing an output frequency includes a current and voltage generator configured to generate a first current, a first voltage and a second voltage, a first switch configured to receive a first control signal, the first control signal being used to close or open the first switch, a second switch configured to receive a second control signal, the second control signal being used to close or open the second switch, a capacitor coupled to the first switch and the second switch. The capacitor is configured to be charged by a second current in response to the first switch being closed and the second switch being open, and to be discharged in response to the first switch being open and the second switch being closed. The second current is related to the first current, and the capacitor is further configured to generate a third voltage. Additionally, the oscillator includes a first comparator configured to receive the first voltage and the third voltage and generate a first comparison signal based at least in part on the first voltage and the third voltage, and a second comparator configured to receive the second voltage and the third voltage and generate a second comparison signal based at least in part on the second voltage and the third voltage. Moreover, the oscillator includes a latch configured to receive the first comparison signal and the second comparison signal and generate the first control signal and the second control signal based at least in part on the first comparison signal and the second comparison signal. The first control signal is an output clock signal associated with the output frequency. Also, the oscillator includes a temperature compensation circuit configured to detect a change in temperature and generate a fourth voltage and a fifth voltage based at least in part on the detected change in temperature. The first comparator is further configured to receive the fourth voltage and the fifth voltage and generate a third current of the first comparator based at least in part on the fourth voltage and the fifth voltage, and the second comparator is further configured to receive the fourth voltage and the fifth voltage and generate a fourth current of the second comparator based at least in part on the fourth voltage and the fifth voltage. The third current of the first comparator changes with the temperature, and the fourth current of the second comparator changes with the temperature.

In yet another embodiment, an oscillator for providing an output frequency includes a current and voltage generator configured to generate a first current, a first voltage and a second voltage, a first switch configured to receive a first control signal, the first control signal being used to close or open the first switch, a second switch configured to receive a second control signal, the second control signal being used to close or open the second switch, and a capacitor coupled to the first switch and the second switch. The capacitor is configured to be charged by a second current in response to the first switch being closed and the second switch being open, and to be discharged in response to the first switch being open and the second switch being closed. The second current is related to the first current, and the capacitor is further configured to generate a third voltage. Additionally, the oscillator includes a first comparator configured to receive the first voltage and the third voltage and generate a first comparison signal based at least in part on the first voltage and the third voltage, and a second comparator configured to receive the second voltage and the third voltage and generate a second comparison signal based at least in part on the second voltage and the third voltage.

Moreover, the oscillator includes a latch configured to receive the first comparison signal and the second comparison signal and generate the first control signal and the second control signal based at least in part on the first comparison signal and the second comparison signal. The first control signal is an output clock signal associated with the output frequency. Also, the oscillator includes a current trimming circuit configured to receive the first current and generate a third current based at least in part on the first current. The third current is equal to the first current divided by a first positive integer, and the second current is generated based at least in part on the third current.

In yet another embodiment, a method for providing an output frequency includes generating a first current, a first voltage and a second voltage, receiving a first control signal to close or open a first switch, receiving a second control signal to close or open a second switch, charging a capacitor by a second current to generate a third voltage in response to the first switch being closed and the second switch being open, the second current being related to the first current, and discharging the capacitor to generate the third voltage in response to the first switch being open and the second switch being closed. Additionally, the method includes detecting a change in temperature, generating a fourth voltage and a fifth voltage based at least in part on the detected change in temperature, receiving the fourth voltage and the fifth voltage, generating a third current of a first comparator based at least in part on the fourth voltage and the fifth voltage, and generating a fourth current of a second comparator based at least in part on the fourth voltage and the fifth voltage. Moreover, the method includes receiving the first voltage and the third voltage, generating a first comparison signal based at least in part on the first voltage, the third voltage and the third current, receiving the second voltage and the third voltage, and generating a second comparison signal based at least in part on the second voltage, the third voltage and the fourth current. Also, the method includes receiving the first comparison signal and the second comparison signal, and generating the first control signal and the second control signal based at least in part on the first comparison signal and the second comparison signal. The first control signal is an output clock signal associated with the output frequency. The third current of the first comparator changes with the temperature, and the fourth current of the second comparator changes with the temperature.

In yet another embodiment, a method for providing an output frequency includes generating a first current, a first voltage and a second voltage, receiving a first control signal to close or open a first switch, receiving a second control signal to close or open a second switch, receiving the first current, generating a second current based at least in part on the first current, the second current being equal to the first current divided by a positive integer, and charging a capacitor by a third current to generate a third voltage in response to the first switch being closed and the second switch being open. The third current is generated based at least in part on the second current. Additionally, the method includes discharging the capacitor by the third current to generate the third voltage in response to the first switch being open and the second switch being closed, receiving the first voltage and the third voltage, generating a first comparison signal based at least in part on the first voltage and the third voltage, receiving the second voltage and the third voltage, and generating a second comparison signal based at least in part on the second voltage and the third voltage. Moreover, the method includes receiving the first comparison signal and the second comparison signal, and generating the first control signal and the second control signal based at least in part on the first comparison signal and the second comparison signal, the first control signal being an output clock signal associated with the output frequency.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

Certain embodiments of the present invention are directed to integrated circuits. More particularly, some embodiments of the invention provide a relaxation oscillator with reduced error or no error in output frequency caused by change in temperature and/or fabrication process. Merely by way of example, some embodiments of the invention have been applied to microcontrollers. But it would be recognized that the invention has a much broader range of applicability.

In theory, a relaxation oscillator, in which a constant reference bias is implemented, may generate a precise output frequency. Generally, the relaxation oscillator charges or discharges a capacitor with a constant current to generate a constant output frequency that is independent of changes in fabrication process (e.g., semiconductor process) and external temperature. However, because of a propagation delay of a comparator that is induced by poor device effects, the output frequency of the relaxation oscillator may contain a relatively large error, especially under low-temperature or high-temperature conditions. In order to generate the precise output frequency for use by, for example, a microcontroller in a relatively large temperature range from a low temperature to a high temperature, certain embodiments of the present invention provide an improved relaxation oscillator.

According to some embodiments of the present invention, a relaxation oscillator includes a reference current and/or voltage generator, a capacitor, a first comparator, a second comparator, a latch and a temperature compensation circuit, wherein: the reference current and/or voltage generator generates a first bias current, a first bias voltage and a second bias voltage; the capacitor is charged by a charging current to generate a charged voltage, the charging current being generated based on at least the first bias current; the first comparator compares the charged voltage and the first bias voltage to generate a first comparison result; the second comparator compares the charged voltage and the second bias voltage to generate a second comparison result; the latch generates a clock signal based on at least the first comparison result and the second comparison result, the clock signal being used to control charging and discharging of the capacitor, a frequency of the clock signal being an output frequency of the relaxation oscillator; and the temperature compensation circuit detects a change in temperature and adjusts bias currents of the first comparator and the second comparator based on at least the detected change in temperature, so that propagation delays of the first comparator and the second comparator remain stable and independent of the change in temperature.

Figure 1:
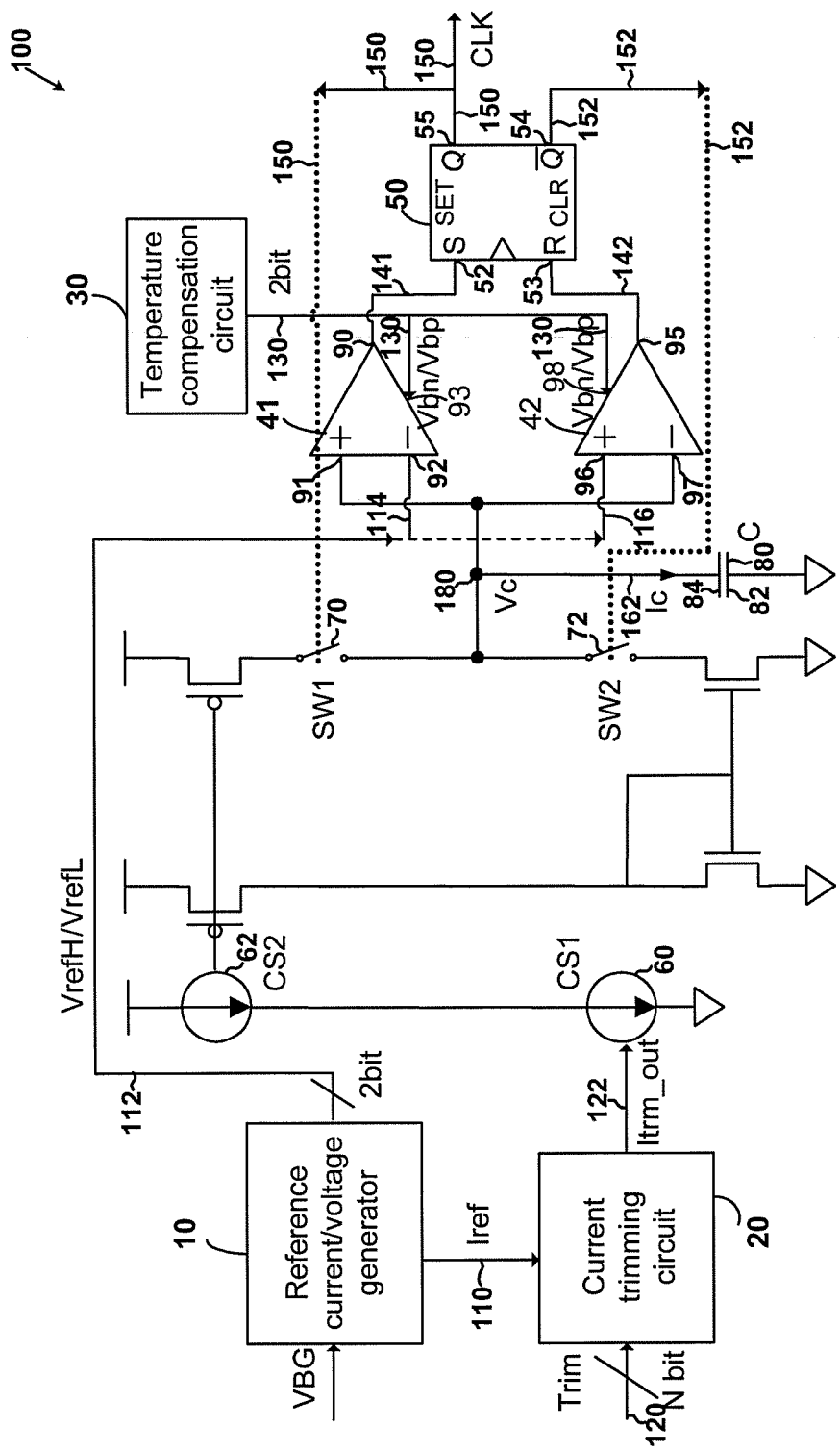
FIG. 1 is a simplified circuit diagram for a relaxation oscillator according to an embodiment of the present invention.

FIG. 1 is a simplified circuit diagram for a relaxation oscillator according to an embodiment of the present invention. This diagram is merely an example, which should not unduly limit the scope of the claims. One of ordinary skill in the art would recognize many variations, alternatives, and modifications. The relaxation oscillator 100 includes a reference current and/or voltage generator 10, a current trimming circuit 20, a current source 60 (e.g., the current source CS1), a current source 62 (e.g., the current source CS2), a switch 70 (e.g., the switch SW1), a switch 72 (e.g., the switch SW2), a temperature compensation circuit 30, a comparator 41, a comparator 42, a capacitor 80 (e.g., the capacitor C) and a latch 50 (e.g., an RS flip-flop).

For example, the reference current and/or voltage generator 10 is a reference current and voltage generator 10. In another example, the capacitor 80 includes capacitor terminals 82 and 84. In yet another example, the comparator 41 includes comparator terminals 90, 91 and 92, and also includes one or more comparator terminals 93. In yet another example, the second comparator 42 includes comparator terminals 95, 96 and 97, and also includes one or more comparator terminals 98. In yet another example, the RS flip-flop 50 includes a terminal 52 (e.g., the input terminal S), a terminal 53 (e.g., the input terminal R), a terminal 54 (e.g., the output terminal $\overline{Q}$), and a terminal 55 (e.g., the output terminal Q).

In one embodiment, the reference current and/or voltage generator 10 generates a bias current 110 (e.g., the bias current Iref), and also generates bias voltages 112 that include a bias voltage 114 (e.g., the bias voltage VrefH) and a bias voltage 116 (e.g., the bias voltage VrefL). For example, the bias current 110 is independent of a power supply and a change in temperature. In another example, the bias voltage 114 (e.g., the bias voltage VrefH) and the bias voltage 116 (e.g., the bias voltage VrefL) are independent of the power supply and the change in temperature.

In another embodiment, the current trimming circuit 20 receives the bias current 110 (e.g., the bias current Iref) from the reference current and/or voltage generator 10, and also receives a signal 120 indicating a positive integer N. For example, the current trimming circuit 20 processes information associated with the bias current 110 and the signal 120, and generates a trimming current 122 (e.g., the trimming current Itrm_out). In another example, the trimming current 122 is determined as follows in magnitude:

$$Itrm\_out = \frac{Iref}{2^N} \quad \text{(Equation 1)}$$

where Itrm_out represents the trimming current 122, and Iref represents the bias current 110. Additionally, N is a positive integer. In yet another example, the trimming current 122 is generated by dividing the bias current 110 by a positive integer equal to $2^N$, so as to reduce or eliminate the influence of fabrication process (e.g., semiconductor process) on an output frequency of the relaxation oscillator 100.

According to one embodiment, the current source 60 (e.g., the current source CS1) receives the trimming current 122 (e.g., the trimming current Itrm_out) and mirrors the trimming current 122 to the current source 62 (e.g., the current source CS2). In one embodiment, in response, the current source 62 provides a charging current 162 (e.g., the charging current Ic) based on the trimming current 122. For example, as shown in FIG. 1, the charging current 162 is proportional to the trimming current 122. In another example, as shown in FIG. 1, the charging current 162 is equal to the trimming current 122.

According to another embodiment, the switch 70 (e.g., the switch SW1) and the switch 72 (e.g., the switch SW2) control charging and discharging of the capacitor 80 (e.g., the capacitor C). For example, the capacitor 80 is charged by the charging current 162 if the switch 70 is closed (e.g., turned on) and the switch 72 is open (e.g., turned off). In another example, the capacitor 80 is discharged if the switch 70 is open (e.g., turned off) and the switch 72 is closed (e.g., turned on). In yet another example, the capacitor terminal 82 is biased to the ground, and the capacitor terminal 84 is at a voltage 180 (e.g., the voltage Vc) that changes with the charging process and/or the discharging process.

In one embodiment, the voltage 180 (e.g., the voltage Vc) is received by the comparator terminal 91 of the comparator 41. For example, the comparator 41 also receives the bias voltage 114 (e.g., the bias voltage VrefH) at the comparator terminal 92, and outputs a comparison signal 141 at the comparator terminal 90. In another example, the comparison signal 141 is generated based at least in part on the voltage 180, the bias voltage 114, and the bias current of the comparator 41. In yet another example, the comparison signal 141 is at a logic high level if the voltage 180 is higher than the bias voltage 114. In yet another example, the comparison signal 141 is at a logic low level if the voltage 180 is lower than the bias voltage 114.

In another embodiment, the voltage 180 (e.g., the voltage Vc) is received by the comparator terminal 97 of the comparator 42. For example, the comparator 42 also receives the bias voltage 116 (e.g., the bias voltage VrefL) at the comparator terminal 96, and outputs a comparison signal 142 at the comparator terminal 95. In another example, the comparison signal 142 is generated based at least in part on the voltage 180, the bias voltage 116, and the bias current of the comparator 42. In yet another example, the comparison signal 142 is at a logic high level if the voltage 180 is higher than the bias voltage 116. In yet another example, the comparison signal 142 is at a logic low level if the voltage 180 is lower than the bias voltage 116 (e.g., the bias voltage VrefL).

According to one embodiment, the temperature compensation circuit 30 generates bias voltages 130 based on change in temperature. For example, the bias voltages 130 are received by the one or more comparator terminals 93 of the comparator 41 to control a bias current of the comparator 41 and thus controls magnitude of the propagation delay of the comparator 41. In another example, the bias voltages 130 are received by the one or more comparator terminals 98 of the comparator 42 to control a bias current of the comparator 42 and thus controls magnitude of the propagation delay of the comparator 42. In yet another example, such control on magnitudes of the propagation delays of the comparators 41 and 42 is implemented to reduce the influence of the change in temperature on the output frequency of the relaxation oscillator 100.

According to another embodiment, the RS flip-flop 50 receives the comparison signal 141 at the terminal 52 (e.g., the input terminal S) and the comparison signal 142 at the terminal 53 (e.g., the input terminal R) and generates a clock signal 150 (e.g., the clock signal CLK) at the terminal 55 (e.g., the output terminal Q) and a signal 152 at the terminal 54 (e.g., the output terminal $\overline{Q}$). For example, the frequency of the clock signal 150 (e.g., the clock signal CLK) is the output frequency of the relaxation oscillator 100.

In one embodiment, the clock signal 150 (e.g., the clock signal CLK) is received by the switch 70 (e.g., the switch SW1) to control whether the switch 70 is closed (e.g., turned on) or open (e.g., turned off), and the signal 152 is received by the switch 72 (e.g., the switch SW2) to control whether the switch 72 is closed (e.g., turned on) or open (e.g., turned off). For example, if the clock signal 150 is at the logic high level, the switch 70 is closed (e.g., turned on), and if the clock signal 150 is at the logic low level, the switch 70 is open (e.g., turned off). In another example, if the signal 152 is at the logic high level, the switch 72 is closed (e.g., turned on), and if the clock signal 152 is at the logic low level, the switch 72 is open (e.g., turned off).

In another embodiment, if the clock signal 150 is at the logic high level, the signal 152 is at the logic low level; if the clock signal 150 is at the logic low level, the signal 152 is at the logic high level. For example, if the switch 70 is open (e.g., turned off), the switch 72 is closed (e.g., turned on). In another example, if the switch 70 is closed (e.g., turned on), the switch 72 is open (e.g., turned off).

In yet another embodiment, under an initial state of the RS flip-flop 50, the clock signal 150 (e.g., the clock signal CLK) is at the logic high level and the signal 152 is at the logic low level. For example, under the initial state of the RS flip-flop 50, the switch 70 (e.g., the switch SW1) is closed (e.g., turned on), and the switch 72 (e.g., the switch SW2) is open (e.g., turned off).

As shown in FIG. 1, the temperature compensation circuit 30 controls the magnitudes of the propagation delays of the comparators 41 and 42 based on the change in temperature according to certain embodiments. For example, such control over the magnitudes of the propagation delays based on the change in temperature is implemented in order to eliminate any error of the output frequency of the relaxation oscillator 100 that is induced by the change in temperature. In another example, such control over the magnitudes of the propagation delays based on the change in temperature is implemented in order to reduce any error of the output frequency of the relaxation oscillator 100 that is induced by the change in temperature. In yet another example, the output frequency of the relaxation oscillator 100 is the frequency of the clock signal 150.

According to some embodiments, the current trimming circuit 20 generates the trimming current 122 (e.g., the trimming current Itrm_out) by equally dividing the bias current 110 (e.g., the bias current Iref) according to Equation 1. For example, such equally dividing the bias current 110 is implemented in order to eliminate any error of the output frequency of the relaxation oscillator 100 that is induced by the change in fabrication process (e.g., semiconductor process). In another example, such equally dividing the bias current 110 is implemented in order to reduce any error of the output frequency of the relaxation oscillator 100 that is induced by the change in fabrication process (e.g., semiconductor process). In yet another example, the output frequency of the relaxation oscillator 100 is the frequency of the clock signal 150.

As discussed above and further emphasized here, FIG. 1 is merely an example, which should not unduly limit the scope of the claims. One of ordinary skill in the art would recognize many variations, alternatives, and modifications.

In one embodiment, the relaxation oscillator 100 includes the current trimming circuit 20 but does not include the temperature compensation circuit 30. For example, the relaxation oscillator 100 does not include the temperature compensation circuit 30, and also does not include any electrical connection between the temperature compensation circuit 30 and the comparator 41 or any electrical connection between the temperature compensation circuit 30 and the comparator 42.

In another embodiment, the relaxation oscillator 100 includes the temperature compensation circuit 30, but does not include the current trimming circuit 20. For example, the relaxation oscillator 100 does not include the current trimming circuit 20, and also does not include the current source 60 (e.g., the current source CS1) or related electrical connections thereof. In another example, for the relaxation oscillator 100, the bias current 110 (e.g., the bias current Iref) is directly provided to the current source 62 (e.g., the current source CS2).

In yet another embodiment, the relaxation oscillator 100 includes the current source 62 (e.g., the current source CS2), but does not include the current source 60 (e.g., the current source CS1). For example, the trimming current 122 (e.g., the trimming current Itrm_out) is directly provided to the current source 62 (e.g., the current source CS2) without being mirrored by the current source 60 (e.g., the current source CS1).

Figure 2:
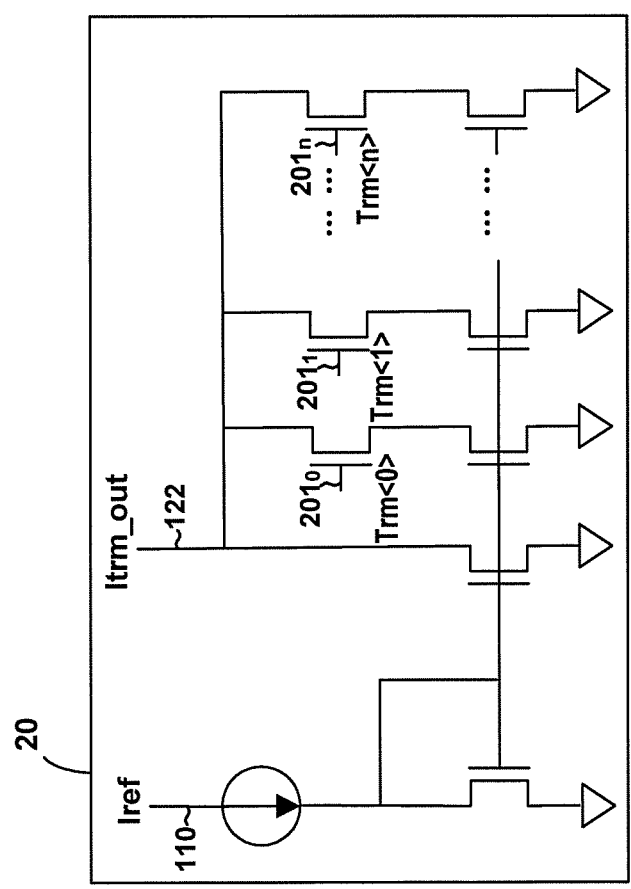
FIG. 2 is a simplified diagram for the current trimming circuit as part of the relaxation oscillator as shown in FIG. 1 according to an embodiment of the present invention.

FIG. 2 is a simplified diagram for the current trimming circuit 20 as part of the relaxation oscillator 100 as shown in FIG. 1 according to an embodiment of the present invention. This diagram is merely an example, which should not unduly limit the scope of the claims. One of ordinary skill in the art would recognize many variations, alternatives, and modifications.

As shown in FIG. 2, the current trimming circuit 20 receives the bias current 110 (e.g., the bias current Iref) and also receives the signal 120 indicating a positive integer N according to some embodiments. For example, based on the signal 120, the current trimming circuit 20 uses a total of N signals including signals $201_0$, $201_1$, ..., and $201_n$ (e.g., the signals Trm <0>, Trm <1>, ..., and Trm <n>) where n is equal to N minus 1. In another example, the signals $201_0$, $201_1$, ..., and $201_n$ (e.g., the signals Trm <0>, Trm <1>, ..., and Trm <n>) are used to open (e.g., turned off) or close (e.g. turned on) N power switches, respectively, in order to generate the trimming current 122 (e.g., the trimming current Itrm_out) according to Equation 1.

Figure 3:
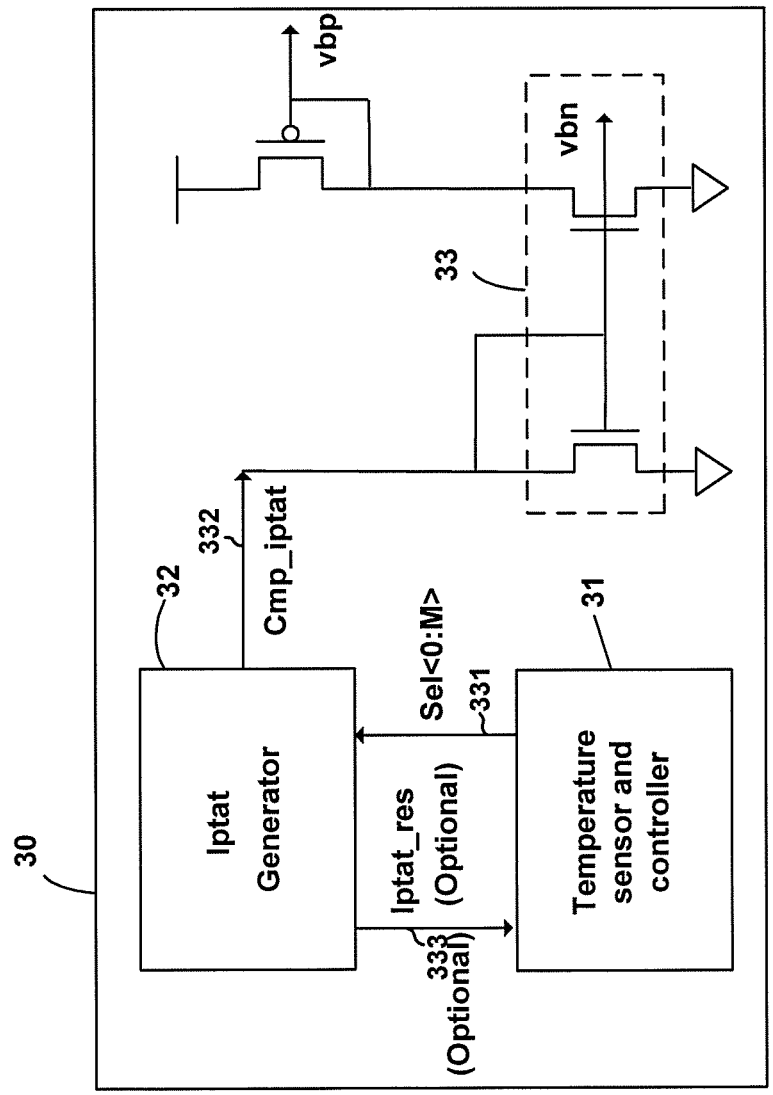
FIG. 3 is a simplified diagram for the temperature compensation circuit as part of the relaxation oscillator as shown in FIG. 1 according to an embodiment of the present invention.

FIG. 3 is a simplified diagram for the temperature compensation circuit 30 as part of the relaxation oscillator 100 as shown in FIG. 1 according to an embodiment of the present invention. This diagram is merely an example, which should not unduly limit the scope of the claims. One of ordinary skill in the art would recognize many variations, alternatives, and modifications. The temperature compensation circuit 30 includes a temperature sensor and controller 31, a current generator 32 (e.g., the Iptat generator) and a current mirror 33.

In one embodiment, the temperature sensor and controller 31 detects the change in temperature and outputs a control signal 331 based on the detected change in temperature. For example, the control signal 331 is the control signal Sel<0: M>, wherein M is a positive integer, which represents the number of bits in the control signal. In another example, the control signal 331 is received by the current generator 32 (e.g., the Iptat generator).

In another embodiment, the current generator 32 generates a bias current 332 (e.g., the current cmp_iptat). For example, the bias current 332 is proportional to the temperature based on the control signal 331 (e.g., the control signal Sel<0:M>). In another example, the bias current 332 is received by the current mirror 33.

In yet another embodiment, the current mirror 33 mirrors the bias current 332 (e.g., the current cmp_iptat) in order to generate the bias voltages 130, which include bias voltages vbn and vbp. For example, the bias voltages vbn and vbp are used to control the bias currents of the comparators 41 and 42 and thus control the magnitudes of the propagation delays of the comparators 41 and 42.

According to some embodiments, the temperature sensor and controller 31 includes an analog-digital converter (ADC) for temperature sensing. In one embodiment, with such analog-digital converter (ADC), the current generator 32 (e.g., the Iptat generator) is further configured to generate a bias current 333 (e.g., the current Iptat_res), which is proportional to the temperature. In another example, the bias current 333 (e.g., the current Iptat_res) is received by the temperature sensor and controller 31. In another embodiment, the temperature sensor and controller 31 converts the bias current 333 (e.g., the current Iptat_res) to a temperature-controlled voltage (e.g., the voltage Vptat) by allowing the bias current 333 to flow through a resistor. For example, the resistor is a part of the temperature sensor and controller 31. In another example, the temperature-controlled voltage (e.g., the voltage Vptat) is proportional to the temperature. In yet another example, the temperature-controlled voltage (e.g., the voltage Vptat) is transmitted to the analog-digital converter (ADC) to determine the temperature in external environment.

According to certain embodiments, the temperature-controlled voltage (e.g., the voltage Vptat) is used by the analog-digital converter (ADC) for temperature sensing as follows: generating a reference voltage by a voltage regulator; generating M reference partial voltages that are not equal to each other from the reference voltage by a series of resistors; comparing the M reference partial voltages with the temperature-controlled voltage (e.g., the voltage Vptat) respectively by M comparators; and connecting output terminals of the M comparators to the current generator 32 (e.g., the Iptat generator). In one embodiment, each comparator of the M comparators represents a temperature sensing point. For example, M temperature points are sensed by the M comparators. In another example, the number of comparators depends on practical applications. In another embodiment, outputs from the output terminals of the M comparators form the control signal 331 (e.g., the control signal Sel<0:M>). For example, the control signal 331 is used to control the bias currents of the comparators 41 and 42 and thus control the propagation delays of the comparators 41 and 42.

Figure 4:
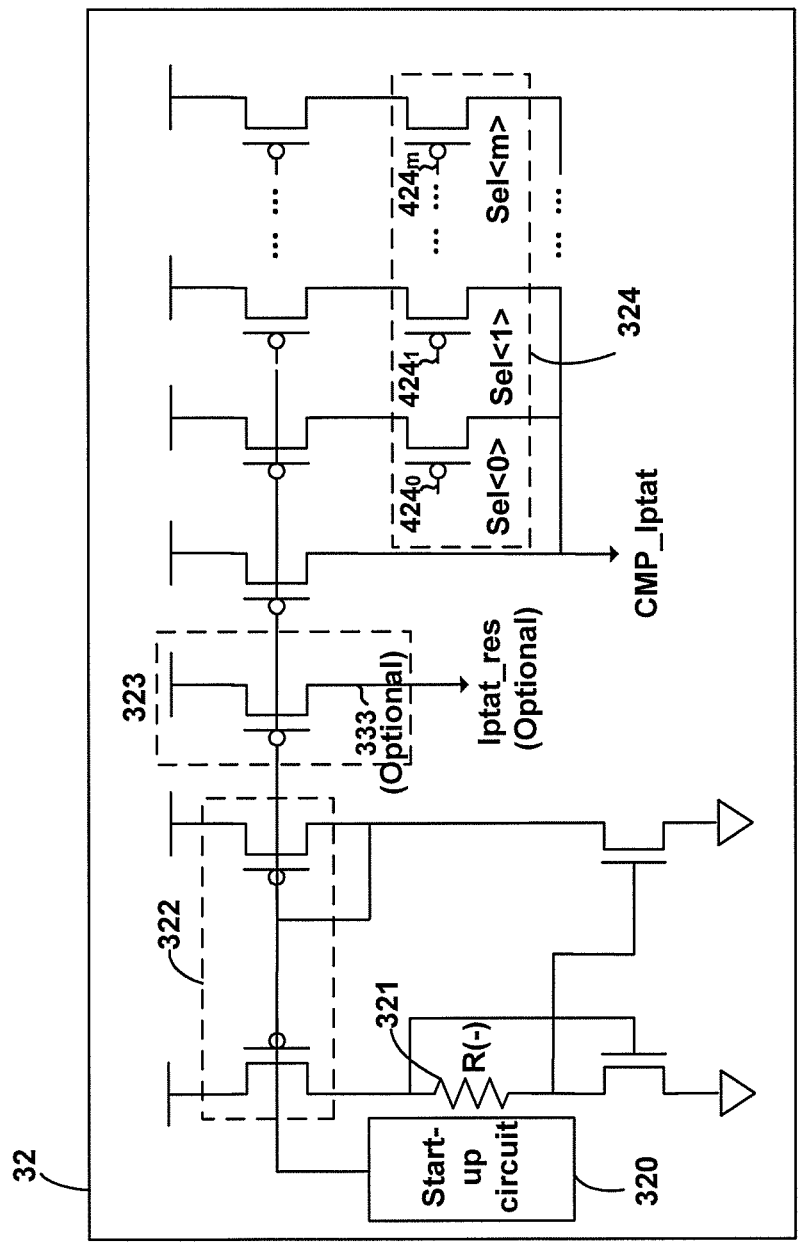
FIG. 4 is a simplified diagram for the current generator of the temperature compensation circuit as part of the relaxation oscillator as shown in FIGS. 1 and 3 according to an embodiment of the present invention.

FIG. 4 is a simplified diagram for the current generator 32 of the temperature compensation circuit 30 as part of the relaxation oscillator 100 as shown in FIGS. 1 and 3 according to an embodiment of the present invention. This diagram is merely an example, which should not unduly limit the scope of the claims. One of ordinary skill in the art would recognize many variations, alternatives, and modifications. The current generator 32 (e.g., the Iptat generator) includes a start-up circuit 320, a theiinal resistor 321, a current mirror 322, a power switch 323, and a plurality of power switches 324. For example, the plurality of power switches 324 includes M power switches.

In one embodiment, the start-up circuit 320 enables the current mirror 322 to operate when the temperature compensation circuit 30 starts up. In another embodiment, the thermal resistor 321 has a negative temperature coefficient. For example, the resistance of the thermal resistor 321 decreases with increasing temperature. In another example, the resistance of the thermal resistor 321 increases with decreasing temperature.

According to one embodiment, the power switch 323 generates the bias current 333 (e.g., the current Iptat_res), which is proportional to the temperature. According to another embodiment, the plurality of power switches 324 receives the control signal 331 (e.g., the control signal Sel<0:M>) from the temperature sensor and controller 31, and generates the bias current 332 (e.g., the current cmp_iptat) based on the control signal 331. For example, the control signal 331 (e.g., the control signal Sel<0:M>) includes a total of M signals including signals $424_0$, $424_1$, . . . , and $424_m$ (e.g., the signals Sel <0>, Sel <1>, . . . , and Sel <m>) where m is equal to M minus 1. In another example, the signals $424_0$, $424_1$, . . . , and $424_m$ (e.g., the signals Sel <0>, Sel <1>, . . . , and Sel <m>) are used to open (e.g., turned off) or close (e.g. turned on) the M power switches, respectively, in order to generate the bias current 332 (e.g., the current cmp_iptat).

According to another embodiment, the temperature sensor and controller 31 includes an analog-digital converter (ADC) for temperature sensing, and with such analog-digital converter (ADC), the current generator 32 (e.g., the Iptat generator) further includes the power switch 323, which generates the bias current 333 (e.g., the current Iptat_res), which is proportional to the temperature.

As discussed above and further emphasized here, FIG. 4 is merely an example, which should not unduly limit the scope of the claims. One of ordinary skill in the art would recognize many variations, alternatives, and modifications. For example, the structural implementation for temperature sensing of the temperature sensor and controller 31 determines whether the power switch 323 is needed or not. In another example, the power switch 323 is removed.

Figure 5:
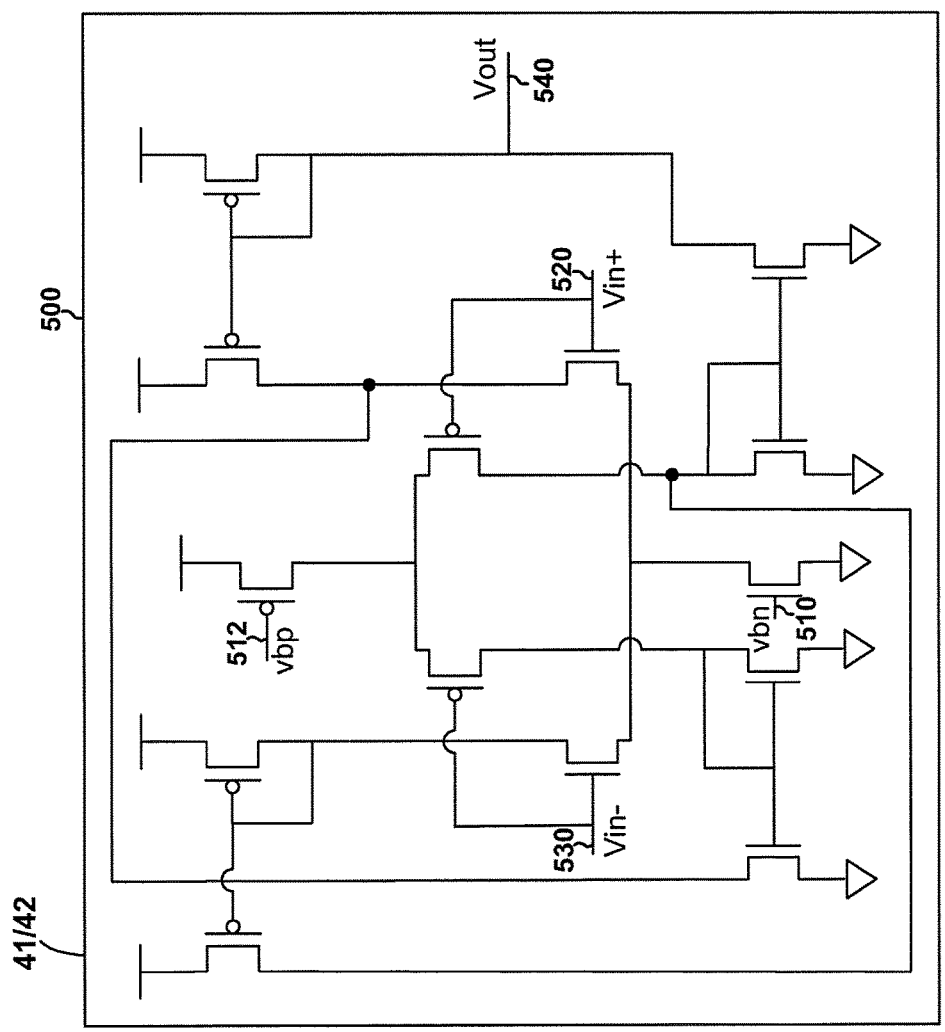
FIG. 5 is a simplified diagram for a comparator as part of the relaxation oscillator as shown in FIG. 1 according to an embodiment of the present invention.

FIG. 5 is a simplified diagram for the comparator 41 or the comparator 42 as part of the relaxation oscillator 100 as shown in FIG. 1 according to an embodiment of the present invention. This diagram is merely an example, which should not unduly limit the scope of the claims. One of ordinary skill in the art would recognize many variations, alternatives, and modifications. For example, the comparator 500 receives the bias voltages 130, which include a bias voltage 510 (e.g., the bias voltage Vbn) and a bias voltage 512 (e.g., the bias voltage Vbp). In another example, the comparator 500 also receives voltages 520 and 530 and generates a comparison signal 540 based on comparison between the voltages 520 and 530.

According to one embodiment, the comparator 500 is the comparator 41. For example, the comparator 500 receives the bias voltages 130 including the bias voltages 510 and 512 at the one or more comparator terminals 93 of the comparator 41. In another example, the voltage 520 is the voltage 180 (e.g., the voltage Vc), which is received by the comparator terminal 91 of the comparator 41. In yet another example, the voltage 530 is the bias voltage 114 (e.g., the bias voltage VrefH), which is received by the comparator terminal 92 of the comparator 41. In yet another example, the comparison signal 540 is the comparison signal 141, which is outputted at the comparator terminal 90 of the comparator 41.

According to another embodiment, the comparator 500 is the comparator 42. For example, the comparator 500 receives the bias voltages 130 including the bias voltages 510 and 512 at the one or more comparator terminals 98 of the comparator 42. In another example, the voltage 520 is the bias voltage 116 (e.g., the bias voltage VrefL), which is received by the comparator terminal 96 of the comparator 42. In yet another example, the voltage 530 is the voltage 180 (e.g., the voltage Vc), which is received by the comparator terminal 97 of the comparator 42.

Figure 6:
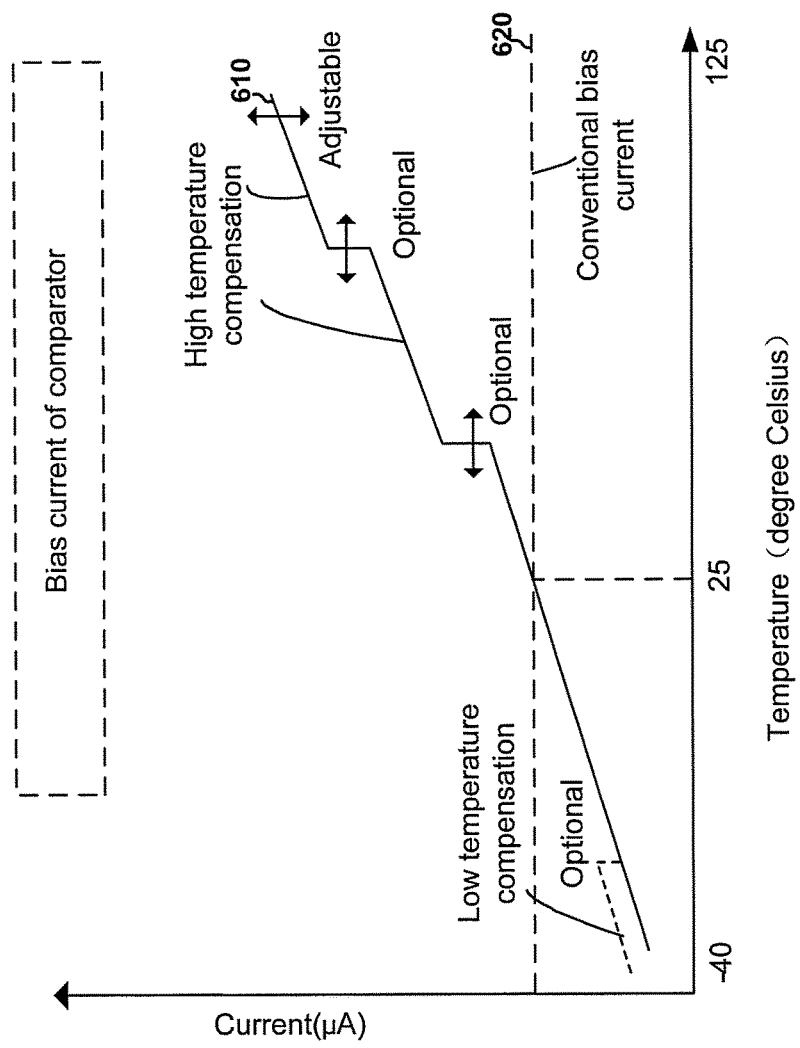
FIG. 6 is a simplified diagram showing the bias current as a function of temperature for a comparator as part of the relaxation oscillator as shown in FIGS. 1 and 5 according to an embodiment of the present invention.

FIG. 6 is a simplified diagram showing the bias current as a function of temperature for the comparator 41 or the comparator 42 as part of the relaxation oscillator 100 as shown in FIGS. 1 and 5 according to an embodiment of the present invention. This diagram is merely an example, which should not unduly limit the scope of the claims. One of ordinary skill in the art would recognize many variations, alternatives, and modifications. The curve 610 shows the bias current as a function of temperature for the comparator 500. For example, the comparator 500 is the comparator 41 as part of the relaxation oscillator 100 as shown in FIGS. 1 and 5. In another example, the comparator 500 is the comparator 42 as part of the relaxation oscillator 100 as shown in FIGS. 1 and 5.

In contrast, the curve 620 shows a conventional bias current as a function of temperature for a comparator. As shown by the curve 620, the conventional bias current is independent of the temperature, and the magnitude of the propagation delay of the comparator is not controlled based on the temperature.

According to certain embodiments of the present invention, the temperature compensation circuit 30 detects the change in temperature and in response adjusts the magnitudes of the bias currents of the comparators 41 and 42 based on the detected change in temperature, so as to control the magnitudes of the propagation delays of the comparators 41 and 42 based on the change in temperature.

In one embodiment, a room temperature of 25 degrees Celsius is used as a reference temperature by the temperature compensation circuit 30. For example, if the temperature drops below the reference temperature, the bias currents of the comparators 41 and 42 are reduced as shown by the curve 610, in order to keep the propagation delays of the comparators 41 and 42 stable; otherwise, without such reduction in the bias currents of the comparators 41 and 42, the propagation delays of the comparators 41 and 42 would have become smaller. In another example, if the temperature rises above the reference temperature, the bias currents of the comparators 41 and 42 are increased as shown by the curve 610, in order to keep the propagation delays of the comparators 41 and 42 stable; otherwise, without such increase in the bias currents of the comparators 41 and 42, the propagation delays of the comparators 41 and 42 would have become larger.

In another embodiment, the reference temperature is determined by the temperature compensation circuit 30. For example, the temperature compensation circuit 30 selects a temperature that is either the same as or different from 25 degrees Celsius as the reference temperature. In another example, the change of the bias currents of the comparators 41 and 42 are achieved by changing the bias voltages 130, which include bias voltages vbn and vbp, and the change of the bias voltages 130 is performed by at least the current generator 32 (e.g., the Iptat generator). In yet another embodiment, as shown by the curve 610, the bias current of the comparator 41 increases with the increasing temperature, and the bias current of the comparator 42 increases with the increasing temperature.

Figure 7:
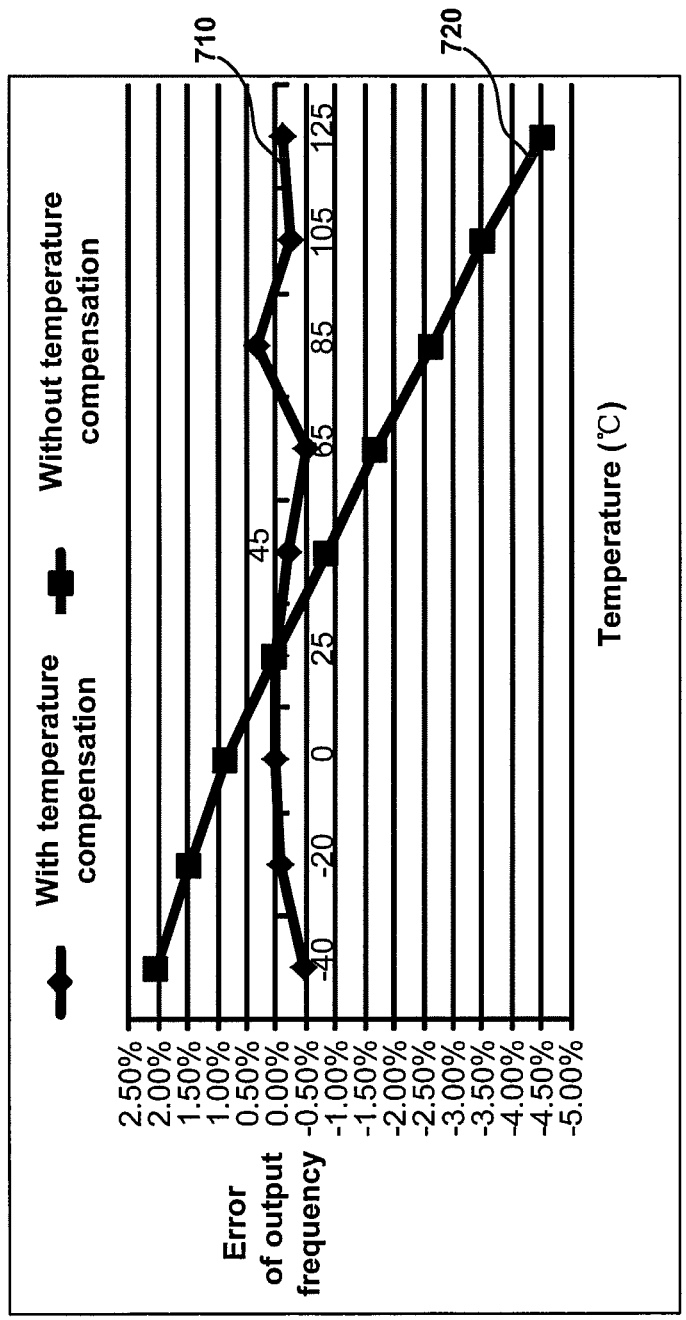
FIG. 7 is a simplified diagram showing relative error of the output frequency as a function of temperature for the relaxation oscillator as shown in FIG. 1 according to an embodiment of the present invention.

FIG. 7 is a simplified diagram showing relative error of the output frequency as a function of temperature for the relaxation oscillator 100 as shown in FIG. 1 according to an embodiment of the present invention. This diagram is merely an example, which should not unduly limit the scope of the claims. One of ordinary skill in the art would recognize many variations, alternatives, and modifications. The curve 710 shows relative error of the output frequency as a function of temperature for the relaxation oscillator 100 as shown in FIG. 1 according to an embodiment of the present invention.

In contrast, the curve 720 shows relative error of the output frequency as a function of temperature for a conventional relaxation oscillator. For example, as shown by the curve 720, the relative error of the output frequency changes from about 2% to about −4.5% as a function of temperature.

According to certain embodiments of the present invention, as shown by the curve 710, the relative error of the output frequency for the relaxation oscillator 100 changes between about 0.5% and about −0.5%. For example, in absolute magnitude, the relative error of the output frequency as shown by the curve 710 is smaller than the relative error of the output frequency as shown by the curve 720 at any temperature other than 25 degrees Celsius. In another example, at 25 degrees Celsius, the relative error of the output frequency as shown by the curve 710 is equal to about zero. In yet another example, the relative error of the output frequency as shown by the curve 710 changes within a range (e.g., between about 0.5% and about −0.5%) that is smaller than a range of change for the relative error of the output frequency as shown by the curve 710 (e.g., between about 2% and about −4.5%).

In one embodiment, the relaxation oscillator 100 generate a relatively precise output frequency (e.g., the frequency of the clock signal 150) that is independent of the change in temperature by controlling the propagation delays of the comparators 41 and 42. In another embodiment, the relaxation oscillator 100 also generate a relatively precise output frequency (e.g., the frequency of the clock signal 150) that is independent of the changes in fabrication process (e.g., semiconductor process) by generating the trimming current 122 according to Equation 1.

In another embodiment, a relaxation oscillator (e.g., the relaxation oscillator 100) includes a reference current and/or voltage generator (e.g., the reference current and/or voltage generator 10), a capacitor (e.g., the capacitor 80), a first comparator (e.g., the comparator 41), a second comparator (e.g., the comparator 42), a latch (e.g., the RS flip-flop 50), and a temperature compensation circuit (e.g., the temperature compensation circuit 30), wherein: the reference current and/or voltage generator generates a first bias current (e.g., the bias current 110), a first bias voltage (e.g., the bias voltage 114) and a second bias voltage (e.g., the bias voltage 116); the capacitor is charged by a charging current (e.g., the charging current 162) to generate a charged voltage (e.g., the voltage 180), the charging current being generated based on at least the first bias current; the first comparator compares the charged voltage and the first bias voltage to generate a first comparison result (e.g., as indicated by the comparison signal 141); the second comparator compares the charged voltage and the second bias voltage to generate a second comparison result (e.g., as indicated by the comparison signal 142); the latch generates a clock signal (e.g., the clock signal 150) based on the first comparison result and the second comparison result, the clock signal being used to control charging and discharging of the capacitor, a frequency of the clock signal being an output frequency of the relaxation oscillator; and the temperature compensation circuit detects a change in temperature and adjusts bias currents of the first comparator and the second comparator based on at least the detected change in temperature, so that propagation delays of the first comparator and the second comparator remain stable and independent of the change in temperature.

For example, the relaxation oscillator (e.g., the relaxation oscillator 100) further includes a current trimming circuit (e.g., the current trimming circuit 20), which generates a trimming current (e.g., the trimming current 122) by dividing the first bias current (e.g., the bias current 110) into multiple parts, wherein the capacitor is charged by the charging current generated based on at least the trimming current.

In another example, the temperature compensation circuit (e.g., the temperature compensation circuit 30) includes a temperature sensor and controller (e.g., the temperature sensor and controller 31), an Iptat generator (e.g., the Iptat generator 32) and a current mirror (e.g., the current mirror 33), wherein: the temperature sensor and controller detects the change in temperature and generates a control signal (e.g., the control signal 331) based on at least the detected change in temperature; the Iptat generator generates a second bias current (e.g., the bias current 332) proportional to the temperature based on at least the control signal; and the current mirror generates a third bias voltage (e.g., the bias voltage vbn) and a fourth bias voltage (e.g., the bias voltage vbp) based on at least the second bias current to adjust the bias currents of the first comparator and the second comparator.

In yet another example, a temperature-sensing part of the temperature sensor and controller (e.g., the temperature sensor and controller 31) is implemented using an analog-digital converter; the Iptat generator (e.g., the Iptat generator 32) further generates a third bias current (e.g., the bias current 333) proportional to the temperature, a temperature-controlled voltage proportional to the temperature being generated by the third bias current (e.g., the bias current 333) flowing through a resistor, the temperature-controlled voltage being used by the analog-digital converter to detect the temperature.

In yet another example, the temperature compensation circuit (e.g., the temperature compensation circuit 30) controls magnitudes of the propagation delays of the first comparator (e.g., the comparator 41) and the second comparator (e.g., the comparator 42) based on the change in temperature. According to one embodiment, the output frequency of the relaxation oscillator (e.g., the relaxation oscillator 100) does not contain an error induced by the change in temperature. According to another embodiment, the output frequency of the relaxation oscillator (e.g., the relaxation oscillator 100) contains an error induced by the change in temperature, but the error has been reduced.

In yet another example, the current trimming circuit (e.g., the current trimming circuit 20) generates the trimming current (e.g., the trimming current 122) by dividing the first bias current (e.g., the bias current 110) generated by the reference current and/or voltage generator (e.g., the reference current and/or voltage generator 10) into multiple parts (e.g., according to Equation 1). According to one embodiment, the output frequency of the relaxation oscillator (e.g., the relaxation oscillator 100) does not contain an error induced by change in semiconductor process. According to another embodiment, the output frequency of the relaxation oscillator (e.g., the relaxation oscillator 100) contains an error induced by change in semiconductor process, but the error has been reduced.

Certain embodiments of the present invention provide a relaxation oscillator including a reference current and/or voltage generator, a capacitor, first and second comparators, a latch, and a temperature compensation circuit. The reference current and/or voltage generator generates a first bias current and first and second bias voltages; the capacitor is charged by a charging current generated from the first bias current to form a charged voltage; the first comparator compares the charged voltage and the first bias voltage to generate a first comparison result; the second comparator compares the charged voltage and the second bias voltage to generate a second comparison result; the latch generates a clock signal, which is used to control charging and discharging of the capacitor, based on the first and second comparison results, a frequency of the clock signal being an output frequency of the relaxation oscillator; and the temperature compensation circuit detects a change in temperature and adjusts bias currents of the first and second comparators based on the detected change in temperature.

In another embodiment, a relaxation oscillator includes a reference generator, a capacitor, a first comparator, a second comparator, a latch, and a temperature compensation circuit. The reference generator is configured to generate a first bias current, a first bias voltage and a second bias voltage. The capacitor is configured to be charged by a charging current to generate a charged voltage, and the charging current is generated based on at least the first bias current. The first comparator is configured to compare the charged voltage and the first bias voltage to generate a first comparison result, and the second comparator is configured to compare the charged voltage and the second bias voltage to generate a second comparison result. The latch is configured to generate a clock signal based on at least the first comparison result and the second comparison result. The clock signal is configured to be used to control charging and discharging of the capacitor, and a frequency of the clock signal is an output frequency of the relaxation oscillator. The temperature compensation circuit is configured to detect a change in temperature and adjusts bias currents of the first comparator and the second comparator based on at least the detected change in temperature, so that propagation delays of the first comparator and the second comparator remain stable and independent of the change in temperature. For example, the relaxation oscillator is implemented according to at least FIG. 1.

In yet another embodiment, an oscillator for providing an output frequency includes a current and voltage generator configured to generate a first current, a first voltage and a second voltage, a first switch configured to receive a first control signal, the first control signal being used to close or open the first switch, a second switch configured to receive a second control signal, the second control signal being used to close or open the second switch, a capacitor coupled to the first switch and the second switch. The capacitor is configured to be charged by a second current in response to the first switch being closed and the second switch being open, and to be discharged in response to the first switch being open and the second switch being closed. The second current is related to the first current, and the capacitor is further configured to generate a third voltage. Additionally, the oscillator includes a first comparator configured to receive the first voltage and the third voltage and generate a first comparison signal based at least in part on the first voltage and the third voltage, and a second comparator configured to receive the second voltage and the third voltage and generate a second comparison signal based at least in part on the second voltage and the third voltage. Moreover, the oscillator includes a latch configured to receive the first comparison signal and the second comparison signal and generate the first control signal and the second control signal based at least in part on the first comparison signal and the second comparison signal. The first control signal is an output clock signal associated with the output frequency. Also, the oscillator includes a temperature compensation circuit configured to detect a change in temperature and generate a fourth voltage and a fifth voltage based at least in part on the detected change in temperature. The first comparator is further configured to receive the fourth voltage and the fifth voltage and generate a third current of the first comparator based at least in part on the fourth voltage and the fifth voltage, and the second comparator is further configured to receive the fourth voltage and the fifth voltage and generate a fourth current of the second comparator based at least in part on the fourth voltage and the fifth voltage. The third current of the first comparator changes with the temperature, and the fourth current of the second comparator changes with the temperature. For example, the relaxation oscillator is implemented according to at least FIG. 1.

In yet another embodiment, an oscillator for providing an output frequency includes a current and voltage generator configured to generate a first current, a first voltage and a second voltage, a first switch configured to receive a first control signal, the first control signal being used to close or open the first switch, a second switch configured to receive a second control signal, the second control signal being used to close or open the second switch, and a capacitor coupled to the first switch and the second switch. The capacitor is configured to be charged by a second current in response to the first switch being closed and the second switch being open, and to be discharged in response to the first switch being open and the second switch being closed. The second current is related to the first current, and the capacitor is further configured to generate a third voltage. Additionally, the oscillator includes a first comparator configured to receive the first voltage and the third voltage and generate a first comparison signal based at least in part on the first voltage and the third voltage, and a second comparator configured to receive the second voltage and the third voltage and generate a second comparison signal based at least in part on the second voltage and the third voltage. Moreover, the oscillator includes a latch configured to receive the first comparison signal and the second comparison signal and generate the first control signal and the second control signal based at least in part on the first comparison signal and the second comparison signal. The first control signal is an output clock signal associated with the output frequency. Also, the oscillator includes a current trimming circuit configured to receive the first current and generate a third current based at least in part on the first current. The third current is equal to the first current divided by a first positive integer, and the second current is generated based at least in part on the third current. For example, the relaxation oscillator is implemented according to at least FIG. 1.

In yet another embodiment, a method for providing an output frequency includes generating a first current, a first voltage and a second voltage, receiving a first control signal to close or open a first switch, receiving a second control signal to close or open a second switch, charging a capacitor by a second current to generate a third voltage in response to the first switch being closed and the second switch being open, the second current being related to the first current, and discharging the capacitor to generate the third voltage in response to the first switch being open and the second switch being closed. Additionally, the method includes detecting a change in temperature, generating a fourth voltage and a fifth voltage based at least in part on the detected change in temperature, receiving the fourth voltage and the fifth voltage, generating a third current of a first comparator based at least in part on the fourth voltage and the fifth voltage, and generating a fourth current of a second comparator based at least in part on the fourth voltage and the fifth voltage. Moreover, the method includes receiving the first voltage and the third voltage, generating a first comparison signal based at least in part on the first voltage, the third voltage and the third current, receiving the second voltage and the third voltage, and generating a second comparison signal based at least in part on the second voltage, the third voltage and the fourth current. Also, the method includes receiving the first comparison signal and the second comparison signal, and generating the first control signal and the second control signal based at least in part on the first comparison signal and the second comparison signal. The first control signal is an output clock signal associated with the output frequency. The third current of the first comparator changes with the temperature, and the fourth current of the second comparator changes with the temperature. For example, the method is implemented according to at least FIG. 1.

In yet another embodiment, a method for providing an output frequency includes generating a first current, a first voltage and a second voltage, receiving a first control signal to close or open a first switch, receiving a second control signal to close or open a second switch, receiving the first current, generating a second current based at least in part on the first current, the second current being equal to the first current divided by a positive integer, and charging a capacitor by a third current to generate a third voltage in response to the first switch being closed and the second switch being open. The third current is generated based at least in part on the second current. Additionally, the method includes discharging the capacitor by the third current to generate the third voltage in response to the first switch being open and the second switch being closed, receiving the first voltage and the third voltage, generating a first comparison signal based at least in part on the first voltage and the third voltage, receiving the second voltage and the third voltage, and generating a second comparison signal based at least in part on the second voltage and the third voltage. Moreover, the method includes receiving the first comparison signal and the second comparison signal, and generating the first control signal and the second control signal based at least in part on the first comparison signal and the second comparison signal, the first control signal being an output clock signal associated with the output frequency. For example, the method is implemented according to at least FIG. 1.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A relaxation oscillator, the oscillator comprising:
a reference generator;
a capacitor;
a first comparator;
a second comparator;
a latch;
a temperature compensation circuit; and
a current trimming circuit configured to generate a trimming current by dividing a first bias current into multiple parts;
wherein:
the reference generator is configured to generate the first bias current, a first bias voltage and a second bias voltage;
the capacitor is configured to be charged by a charging current to generate a charged voltage, the charging current being generated based on at least the first bias current;
the first comparator is configured to compare the charged voltage and the first bias voltage to generate a first comparison result;
the second comparator is configured to compare the charged voltage and the second bias voltage to generate a second comparison result;
the latch is configured to generate a clock signal based on at least the first comparison result and the second comparison result, the clock signal being configured to be used to control charging and discharging of the capacitor, a frequency of the clock signal being an output frequency of the relaxation oscillator; and
the temperature compensation circuit is configured to detect a change in temperature and adjust bias currents of the first comparator and the second comparator based on at least the detected change in temperature, so that propagation delays of the first comparator and the second comparator remain stable and independent of the change in temperature;
wherein the capacitor is configured to be charged by the charging current generated based on at least the trimming current.

2. A relaxation oscillator, the oscillator comprising:
a reference generator;
a capacitor;
a first comparator;
a second comparator;
a latch; and
a temperature compensation circuit;
wherein:
the reference generator is configured to generate a first bias current, a first bias voltage and a second bias voltage;
the capacitor is configured to be charged by a charging current to generate a charged voltage, the charging current being generated based on at least the first bias current;
the first comparator is configured to compare the charged voltage and the first bias voltage to generate a first comparison result;
the second comparator is configured to compare the charged voltage and the second bias voltage to generate a second comparison result;
the latch is configured to generate a clock signal based on at least the first comparison result and the second comparison result, the clock signal being configured to be used to control charging and discharging of the capacitor, a frequency of the clock signal being an output frequency of the relaxation oscillator; and
the temperature compensation circuit is configured to detect a change in temperature and adjust bias currents of the first comparator and the second comparator based on at least the detected change in temperature, so that propagation delays of the first comparator and the second comparator remain stable and independent of the change in temperature:
wherein the temperature compensation circuit includes:
a temperature sensor and controller;
an Iptat generator; and
a current mirror;
wherein:
the temperature sensor and controller is configured to detect the change in temperature and generate a control signal based on at least the detected change in temperature;
the Iptat generator is configured to generate a second bias current proportional to the temperature based on at least the control signal; and
the current mirror is configured to generate a third bias voltage and a fourth bias voltage based on at least the second bias current to adjust the bias currents of the first comparator and the second comparator.

3. The relaxation oscillator of claim 2, wherein a temperature sensing part of the temperature sensor and controller is implemented using an analog-digital converter.

4. The relaxation oscillator of claim 3, wherein:
the Iptat generator is further configured to generate a third bias current proportional to the temperature;
the third bias current is configured to flow through a resistor to generate a temperature-controlled voltage proportional to the temperature; and
the temperature-controlled voltage is configured to be used by the analog-digital converter to detect the temperature.

5. An oscillator for providing an output frequency, the oscillator comprising:
a current and voltage generator configured to generate a first current, a first voltage and a second voltage;
a first switch configured to receive a first control signal, the first control signal being used to close or open the first switch;
a second switch configured to receive a second control signal, the second control signal being used to close or open the second switch;
a capacitor coupled to the first switch and the second switch, the capacitor being configured to be charged by a second current in response to the first switch being closed and the second switch being open and to be discharged in response to the first switch being open and the second switch being closed, the second current being related to the first current, the capacitor being further configured to generate a third voltage;

a first comparator configured to receive the first voltage and the third voltage and generate a first comparison signal based at least in part on the first voltage and the third voltage;
a second comparator configured to receive the second voltage and the third voltage and generate a second comparison signal based at least in part on the second voltage and the third voltage;
a latch configured to receive the first comparison signal and the second comparison signal and generate the first control signal and the second control signal based at least in part on the first comparison signal and the second comparison signal, the first control signal being an output clock signal associated with the output frequency; and
a temperature compensation circuit configured to detect a change in temperature and generate a fourth voltage and a fifth voltage based at least in part on the detected change in temperature;
wherein:
the first comparator is further configured to receive the fourth voltage and the fifth voltage and generate a third current of the first comparator based at least in part on the fourth voltage and the fifth voltage;
the second comparator is further configured to receive the fourth voltage and the fifth voltage and generate a fourth current of the second comparator based at least in part on the fourth voltage and the fifth voltage;
wherein:
the third current of the first comparator changes with the temperature; and
the fourth current of the second comparator changes with the temperature.

6. The oscillator of claim 5 wherein the latch includes a flip-flop.

7. The oscillator of claim 6 wherein:
if the first control signal is at a first logic level, the second control signal is at a second logic level; and
if the first control signal is at the second logic level, the second control signal is at the first logic level.

8. The oscillator of claim 5 wherein:
the third current of the first comparator increases with the temperature; and
the fourth current of the second comparator increases with the temperature.

9. The oscillator of claim 5, and further comprising:
a current trimming circuit configured to receive the first current and generate a fifth current based at least in part on the first current;
wherein the fifth current is equal to the first current divided by a first positive integer.

10. The oscillator of claim 9 wherein:
the current trimming circuit is further configured to:
receive an input signal, the input signal indicating a second positive integer; and
generate the fifth current based at east in part on the first current and the input signal.

11. The oscillator of claim 10 wherein the fifth current is equal to the first current divided by $2^N$, N being the second positive integer.

12. The oscillator of claim 9 wherein the second current is generated based at least in part on the fifth current.

13. The oscillator of claim 5 wherein the temperature compensation circuit includes:
a temperature sensor and controller configured to detect the change in temperature and generate a control signal based at least in part on the detected change in temperature;
a current generator configured to receive the control signal and generate a fifth current based at least in part on the control signal; and
a current mirror configured to receive the fifth current to generate the fourth voltage and the fifth voltage based at least in part on the fifth current.

14. The oscillator of claim 13 wherein the fifth current is proportional to the temperature.

15. An oscillator for providing an output frequency, the oscillator comprising:
a current and voltage generator configured to generate a first current, a first voltage and a second voltage;
a first switch configured to receive a first control signal, the first control signal being used to close or open the first switch;
a second switch configured to receive a second control signal, the second control signal being used to close or open the second switch;
a capacitor coupled to the first switch and the second switch, the capacitor being configured to be charged by a second current in response to the first switch being closed and the second switch being open and to be discharged in response to the first switch being open and the second switch being closed, the second current being related to the first current, the capacitor being further configured to generate a third voltage;
a first comparator configured to receive the first voltage and the third voltage and generate a first comparison signal based at least in part on the first voltage and the third voltage;
a second comparator configured to receive the second voltage and the third voltage and generate a second comparison signal based at least in part on the second voltage and the third voltage;
a latch configured to receive the first comparison signal and the second comparison signal and generate the first control signal and the second control signal based at least in part on the first comparison signal and the second comparison signal the first control signal being an output clock signal associated with the output frequency; and
a current trimming circuit configured to receive the first current and generate a third current based at least in part on the first current;
wherein:
the third current is equal to the first current divided by a first positive integer; and
the second current is generated based at least in part on the third current:
wherein the current trimming circuit is further configured to:
receive an input signal, the input signal indicating a second positive integer; and
generate the third current based at least in part on the first current and the input signal;
wherein the third current is equal to the first current divided by $2^N$, N being the second positive integer.

16. The oscillator of claim 15 wherein the latch includes a flip-flop.

17. The oscillator of claim 16 wherein:
if the first control signal is at a first logic level, the second control signal is at a second logic level; and
if the first control signal is at the second logic level, the second control signal is at the first logic level.

18. A method for providing an output frequency, the method comprising:
generating a first current, a first voltage and a second voltage;
receiving a first control signal to close or open a first switch;

receiving a second control signal to close or open a second switch;

charging a capacitor by a second current to generate a third voltage in response to the first switch being closed and the second switch being open, the second current being related to the first current;

discharging the capacitor to generate the third voltage in response to the first switch being open and the second switch being closed;

detecting a change in temperature;

generating a fourth voltage and a fifth voltage based at least in part on the detected change in temperature;

receiving the fourth voltage and the fifth voltage;

generating a third current of a first comparator based at least in part on the fourth voltage and the fifth voltage;

generating a fourth current of a second comparator based at least in part on the fourth voltage and the fifth voltage;

receiving the first voltage and the third voltage;

generating a first comparison signal based at least in part on the first voltage, the third voltage and the third current;

receiving the second voltage and the third voltage;

generating a second comparison signal based at least in part on the second voltage, the third voltage and the fourth current;

receiving the first comparison signal and the second comparison signal;

generating the first control signal and the second control signal based at least in part on the first comparison signal and the second comparison signal, the first control signal being an output clock signal associated with the output frequency;

wherein:
the third current of the first comparator changes with the temperature; and
the fourth current of the second comparator changes with the temperature.

19. The method of claim 18 wherein:
if the first control signal is at a first logic level, the second control signal is at a second logic level; and
if the first control signal is at the second logic level, the second control signal is at the first logic level.

20. The method of claim 18 wherein:
the third current of the first comparator increases with the temperature; and
the fourth current of the second comparator increases with the temperature.

21. The method of claim 18, and further comprising:
receiving the first current; and
generating a fifth current based at least in part on the first current;
wherein the fifth current is equal to the first current divided by a first positive integer.

22. The method of claim 21 wherein the generating a fifth current based at least in part on the first current includes:
receiving an input signal, the input signal indicating a second positive integer; and
generating the fifth current based at least in part on the first current and the input signal.

23. The method of claim 22 wherein the fifth current is equal to the first current divided by $2^N$, N being the second positive integer.

24. The method of claim 21 wherein the second current is generated based at least in part on the fifth current.

25. The method of claim 18 wherein:
the detecting a change in temperature includes:
detecting the change in temperature; and
generating a control signal based at least in part on the detected change in temperature;
the generating a fourth voltage and a fifth voltage based at least in part on the detected change in temperature includes:
receiving the control signal;
generating a fifth current based at least in part on the control signal;
receiving the fifth current; and
generating the fourth voltage and the fifth voltage based at least in part on the fifth current.

26. The method of claim 25 wherein the fifth current is proportional to the temperature.

* * * * *